United States Patent
Chen et al.

(10) Patent No.: US 8,860,224 B2
(45) Date of Patent: Oct. 14, 2014

(54) PREVENTING THE CRACKING OF PASSIVATION LAYERS ON ULTRA-THICK METALS

(75) Inventors: Yu-Wen Chen, Baoshan Township (TW); Chuang-Han Hsieh, Kaohsiung (TW); Kun-Yu Lin, Tainan County (TW); Kuan-Chi Tsai, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 237 days.

(21) Appl. No.: 13/035,517

(22) Filed: Feb. 25, 2011

(65) Prior Publication Data

US 2012/0217641 A1   Aug. 30, 2012

(51) Int. Cl.
*H01L 29/06* (2006.01)
*H01L 23/48* (2006.01)
*H01L 21/768* (2006.01)
*H01L 23/528* (2006.01)
*H01L 23/522* (2006.01)

(52) U.S. Cl.
CPC .... *H01L 21/76885* (2013.01); *H01L 21/76832* (2013.01); *H01L 23/5283* (2013.01); *H01L 23/5227* (2013.01); *H01L 21/76834* (2013.01)
USPC .............. 257/771; 257/750; 257/E23.141; 257/E23.142

(58) Field of Classification Search
CPC ..................... H01L 2223/6627; H01L 23/522; H01L 23/481; H01L 23/482; H01L 23/485; H01L 33/44; H01L 23/3171
USPC ........... 257/771, 773, 750, E23.141, E23.142
See application file for complete search history.

(56) References Cited

U.S. PATENT DOCUMENTS

| | | | |
|---|---|---|---|
| 6,200,889 B1 * | 3/2001 | Rolfson | 438/612 |
| 2006/0192289 A1 * | 8/2006 | Drexl et al. | 257/758 |
| 2006/0267198 A1 * | 11/2006 | Lin et al. | 257/750 |
| 2008/0290444 A1 * | 11/2008 | Crawley et al. | 257/503 |
| 2009/0079080 A1 | 3/2009 | Stecher | |

* cited by examiner

*Primary Examiner* — Peniel M Gumedzoe
(74) *Attorney, Agent, or Firm* — Slater & Matsil, L.L.P.

(57) ABSTRACT

A device includes a top metal layer; a UTM line over the top metal layer and having a first thickness; and a passivation layer over the UTM line and having a second thickness. A ratio of the second thickness to the first thickness is less than about 0.33.

18 Claims, 4 Drawing Sheets

PREVENTING THE CRACKING OF PASSIVATION LAYERS ON ULTRA-THICK METALS

BACKGROUND

To reduce the resistance of metal lines, Ultra-Thick Metal (UTM) lines are formed in integrated circuits. With the reduced resistance, the performance of integrated circuit devices, such as inductors, may be improved to satisfy the requirements of certain performance demanding circuits such as mixed-signal circuits, analog circuits, and radio frequency (RF) circuits.

The UTM lines may be covered with a passivation layer. However, due to the significant thickness of the UTM lines, and further due to the mismatch in coefficients of thermal expansion (CTEs) of the UTM lines and the passivation layer, the passivation layer suffers from cracking when experiencing thermal cycles. The cracks may also propagate from the passivation layer to the underlying dielectric layers, and hence the yield of the respective integrated circuit formation processes is adversely affected. Conventionally, to prevent the cracking in a passivation layer, the thickness of the passivation layer was increased to greater than that of the UTM lines. This approach, however, results in increased manufacturing cost and reduced throughput.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel integrated circuit device including Ultra-Thick Metal (UTM) lines and the method of forming the same are provided in accordance with an embodiment. The intermediate stages of manufacturing the embodiment are illustrated. The variations of the embodiment are discussed. Throughout the various views and illustrative embodiments, like reference numbers are used to designate like elements.

Figure 1:
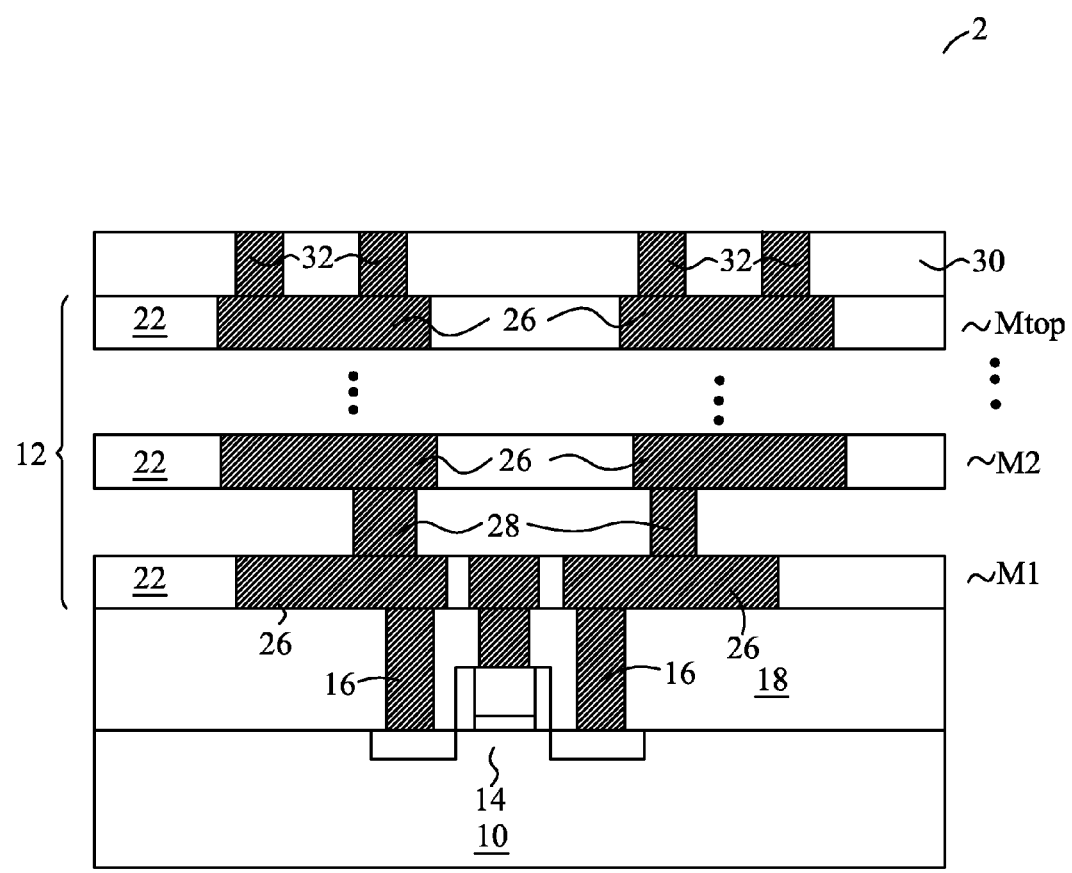
FIGS. 1 through 3 are cross-sectional views of intermediate stages in the manufacturing of an integrated circuit structure comprising ultra-thick metal lines and a passivation layer over the ultra-thick metal lines.

Referring to FIG. 1, wafer 2 is provided. Wafer 2 includes substrate 10. In an embodiment, substrate 10 is a semiconductor substrate, such as a silicon substrate, although it may include other semiconductor materials, such as silicon germanium, silicon carbide, gallium arsenide, or the like. Semiconductor devices 14, which are symbolized using a transistor, may be formed at a surface of substrate 10. In alternative embodiments, substrate 10 is a dielectric substrate, and no active devices are formed on the dielectric substrate, although passive devices such as capacitors, inductors, resistors, and the like may be formed. Contact plugs 16 are formed in inter-layer dielectric (ILD) 18, and may be electrically coupled to devices 14.

Interconnect structure 12, which includes metal lines 26 and vias 28 therein and electrically coupled to semiconductor devices 14, is formed over ILD 18. Metal lines 26 and vias 28 may be formed of substantially pure copper (for example, with a weight percentage of copper being greater than about 90 percent, or greater than about 95 percent) or copper alloys, and may be formed using the single and/or dual damascene processes. Metal lines 26 and vias 28 may be, or may not be, substantially free from aluminum. Interconnect structure 12 includes a plurality of metal layers, namely M1, M2 ... Mtop, wherein metal layer M1 is the metal layer immediately above ILD 18, while metal layer Mtop is the top metal layer that is immediately under the overlying UTM lines 36 (not shown in FIG. 1, please refer to FIG. 3), which are formed in subsequent steps. Throughout the description, the term "metal layer" refers to the collection of the metal lines in the same layer. Metal layers M1 through Mtop are formed in inter-metal dielectrics (IMDs) 22, which may be formed of oxides such as Un-doped Silicate Glass (USG), Fluorinated Silicate Glass (FSG), low-k dielectric materials, or the like. The low-k dielectric materials may have k values lower than 3.8, although the dielectric materials of IMDs 22 may also be close to 3.8. In some embodiments, the k values of the low-k dielectric materials are lower than about 3.0, and may be lower than about 2.5.

In the following discussed embodiments, the top metal layer Mtop may be metal layer M5, although in other embodiments, a metal layer higher than or lower than M5 may be the Mtop layer. Furthermore, in exemplary embodiments, metal layer M1 may have a thickness between about 2.0 kilo-Angstroms (kÅ) and about 3.5 kÅ, and metal layer layers M2 through Mtop may have thicknesses between about 3.0 kÅ and about 4.0 kÅ. It is realized, however, that the dimensions recited throughout the description are merely examples, and may be changed in alternative embodiments.

FIG. 1 also illustrates the formation of via-dielectric layer 30 and metal vias 32 in via-dielectric layer 30. In an embodiment, via-dielectric layer 30 may be formed of an oxide such as USG, FSG, a low-k oxide, or the like. Via-dielectric layer 30 may have a thickness between about 3 kÅ and about 8 kÅ, for example.

Vias 32 are formed in via-dielectric layer 30, and are electrically connected to metal lines 26 in top metal layer Mtop. In an exemplary embodiment, the formation of vias 32 may include, for example, etching via-dielectric layer 30 to form via openings, and filling a metallic material into the via openings. A planarization may then be performed to remove excess metallic material over via-dielectric layer 30, and the remaining metallic material in the via openings forms vias 32.

Figure 2:
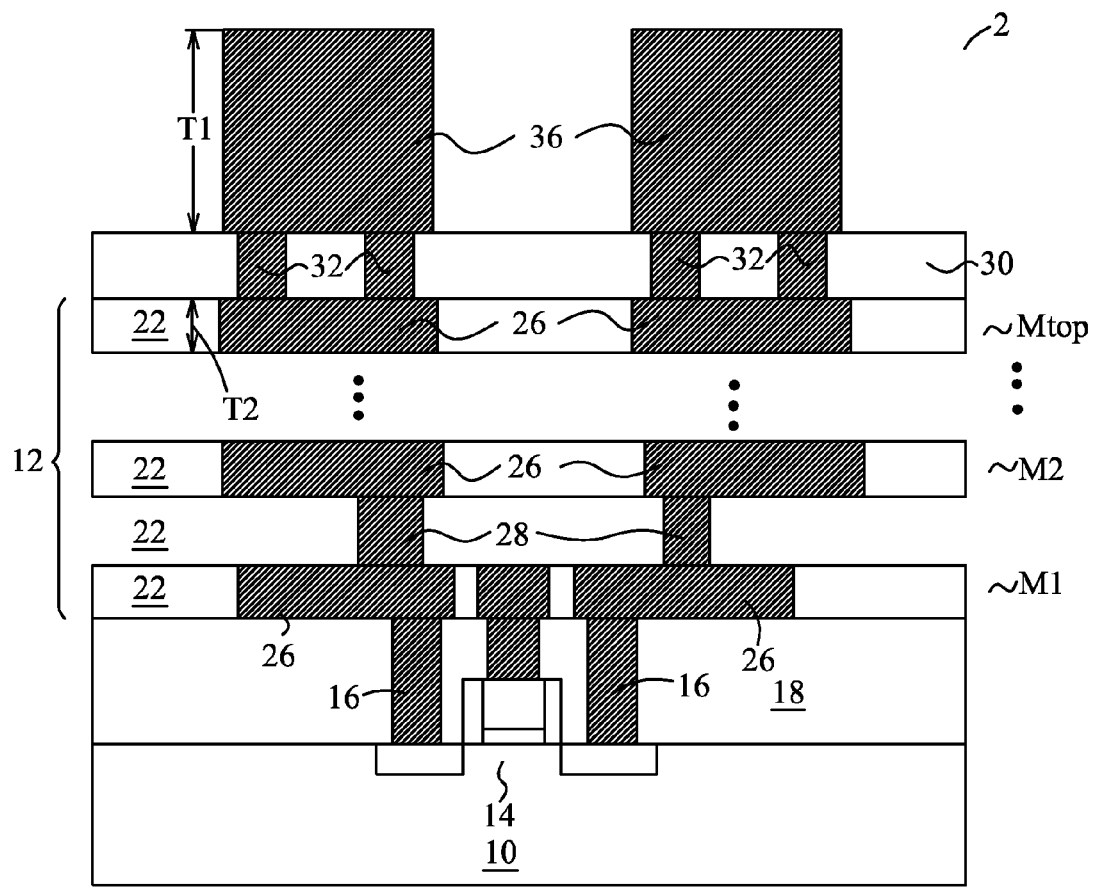

FIG. 2 illustrates the formation of UTM lines 36. UTM lines 36 may be formed of aluminum, aluminum copper, or the like, although other materials such as copper, tungsten, nickel, palladium, or the like may also be used or added. Thickness T1 of UTM lines 36 may be significantly greater than thickness T2 of the Mtop layer. In an embodiment, ratio T1/T2 is greater about 5, or greater than about 10. Ratio T1/T2 may also be between about 8 and about 12. Thickness T1 of UTM lines 36 may be greater than about 20 kÅ (hence the name ultra-thick metal lines), and may be greater than about 30 kÅ, or even greater than about 40 kÅ. In some embodiments, thickness T1 is between about 25 kÅ and about 40 kÅ. The formation process of UTM lines 36 may include blanket depositing a thick metal layer, and then patterning the thick metal layer, and the remaining portions of the thick metal layer form UTM lines 36.

Figure 3:
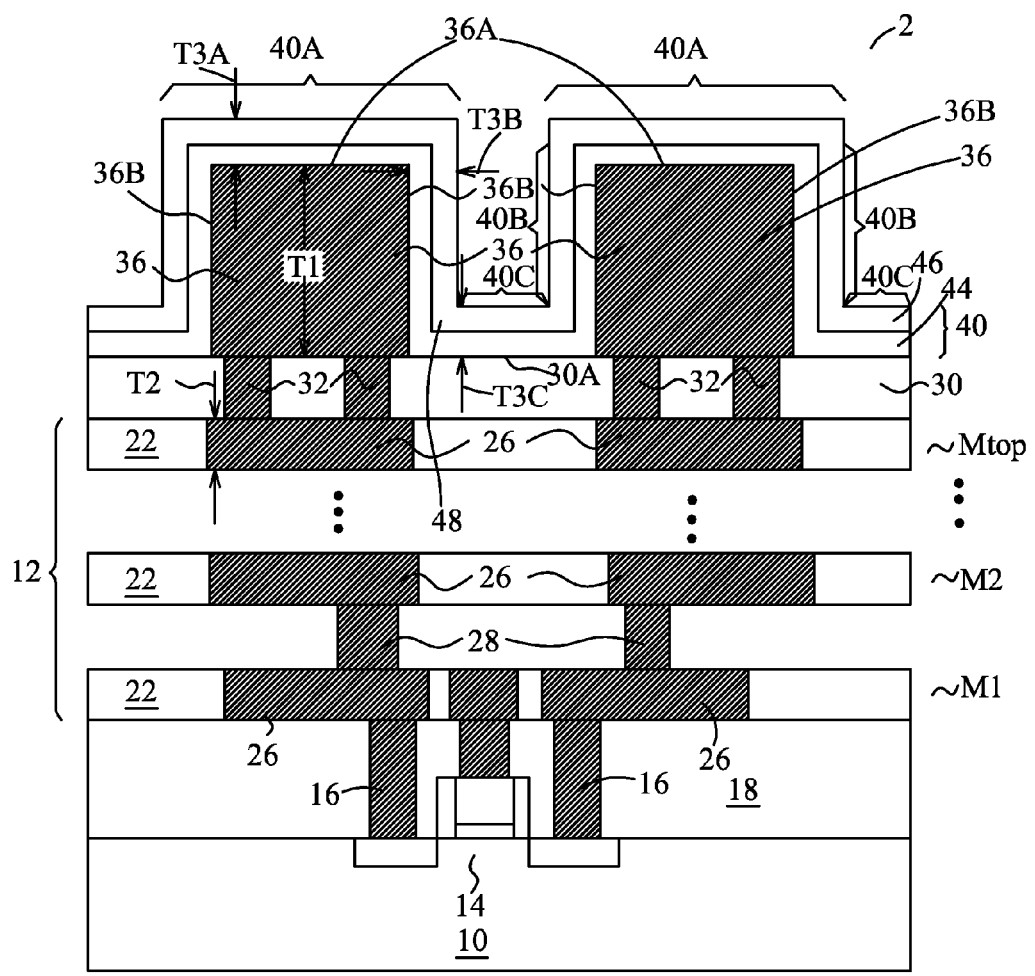

Next, as shown in FIG. 3, passivation layer 40 is formed to cover the top surface and sidewalls of UTM lines 36. In an embodiment, passivation layer 40 contacts top surface 36A and sidewalls 36B of UTM lines 36. Furthermore, passivation layer 40 extends into the space between neighboring UTM lines 36, and may contact top surface 30A of via-dielectric layer 30. The formation methods of passivation layer 40 include commonly used deposition methods such high-density plasma (HDP) chemical vapor deposition (CVD), which is also known as HDP, although other applicable deposition methods may also be used.

Passivation layer 40 is formed of a dielectric material(s). In an embodiment, passivation layer 40 comprises silicon oxide layer 44 and silicon nitride layer 46 over silicon oxide layer 44, although other types of oxide materials and nitride materials may be used. Passivation layer 40 may also be formed materials other than oxides and/or nitrides, and may be a homogeneous layer or a composite layer comprising sub layers formed of different materials. Thicknesses T3 (denoted as T3A, T3B, and T3C) of passivation layer 40 may be smaller than about 13.5 kÅ, and may be between about 9 kÅ and about 13.5 kÅ in some embodiments. Passivation layer 40 may include top portions 40A that are over and contacting UTM lines 36, sidewall portions 40B that are on and contact sidewalls 36B of UTM lines 36, and bottom portions 40C. Bottom portions 40C may contact the top surface of via-dielectric layer 30. In an embodiment, passivation layer 40 is substantially conformal, and portions 40A, 40B, and 40C have thicknesses close to each other, and may have substantially the same thickness. For example, if the thickness of portions 40A is denoted as T3A, the thickness of portions 40B is denoted as T3B, and the thickness of portions 40C is denoted as T3C, then ratio T3A/T3C may be between about 0.9 and about 1.1, and ratio T3B/T3A may be between about 0.7 and 1. In the embodiments wherein passivation layer 40 comprises silicon oxide layer 44 and nitride layer 46, a ratio of the thickness of silicon oxide layer 44 to the thickness of silicon nitride layer 46 may be between about 0.285 and about 1.875.

In an embodiment, thickness ratio T3A/T1 is smaller than about 0.33, or lower than about 0.25. Table 1 illustrates the experiment results indicating the correlation between the thickness ratios and the failure rates of dies, which failure rates are the results of the failures caused by the cracking of passivation layer 40.

TABLE 1

| Ratio | Crack | Failure rate |
| --- | --- | --- |
| 0.225 | No | 0 |
| 0.3375 | No | 0 |
| 0.3875 | YES | 100% |
| 0.425 | YES | 100% |
| 0.44 | YES | 100% |
| 0.4875 | YES | 100% |

The second column of Table 1 indicates whether cracks occur or not. As schematically shown with dotted line 48 in FIG. 3, the cracks may occur in passivation layer 40, and the cracks may propagate to the underlying dielectric layers 22, causing yield loss, which is indicated by the column "Failure rate" in Table 1. The experiment results revealed that when thickness ratio T3A/T1 is about 0.3875 or higher, the failure rate of the dies associated with the passivation crack is about 100 percent. Contrary to the conventional thinking, the experiment results also revealed that reducing the thickness of passivation layer 40, hence reducing thickness ratio T3A/T1, can also lead to the reduction in the failure rates associated with the passivation cracks. Through Table 1, it is found that when ratio T3A/T1 is equal to 0.3375 or lower, the failure rates decrease to zero percent. Accordingly, in the embodiments, ratio T3A/T1 may be set to lower than about 0.3375. Also, to provide enough buffer for the reliable reduction of the failure rates to zero percent, ratio T3A/T1 may be set to lower than about 0.25.

It is appreciated that the experiment results were obtained from passivation layer 40 including an oxide layer and a nitride layer. When the material of passivation layer 40 is changed, the results may be slightly different, and the optimum ratio T3A/T1 may be found through experiments.

Figure 4:
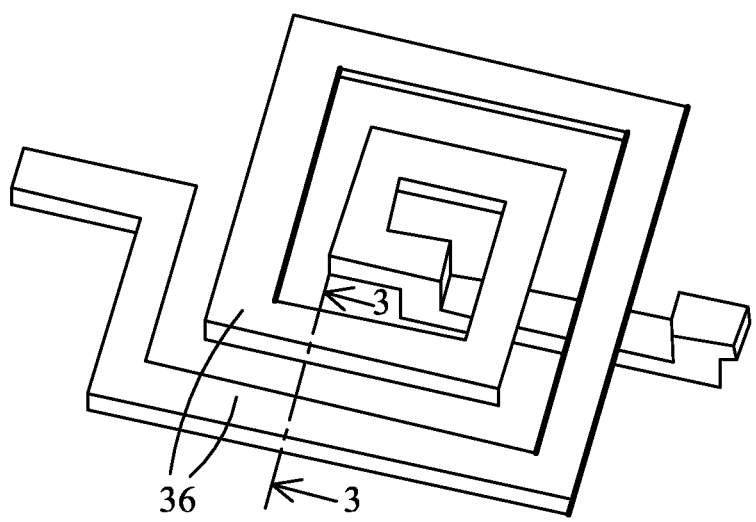
FIG. 4 illustrates a perspective view of an inductor formed with the ultra-thick metal lines.

UTM lines 36 may be used to form various devices such as inductors so that the resistance of the respective devices may be reduced, resulting in improved performance for the respective devices. FIG. 4 illustrates a perspective view of an exemplary inductor comprising UTM lines 36. The cross-sectional view as shown in FIG. 3 may be obtained in the plane crossing line 3-3 in FIG. 4. It is realized that inductors may have many designs. For example, the UTM lines 36, instead of forming the square shape as shown in FIG. 4, may also have the spiral form with a hexagon shape, an octagon shape, or another kind of shape.

Figure 5:
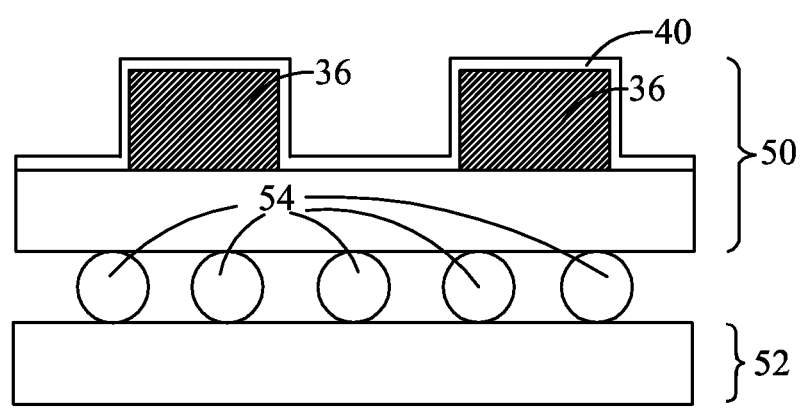
FIG. 5 illustrates a package structure comprising a die including the ultra-thick metal lines, wherein the die is bonded to a package component.

Referring back to FIG. 3, after the formation of passivation layer 40, wafer 2 may be sawed into individual dies and packaged. Accordingly, no additional layers are formed over passivation layer 40 in the respective packages in some embodiments. An exemplary package is shown in FIG. 5, which illustrates that die 50, which is sawed from wafer 2, is bonded to package component 52, such as a package substrate, an interposer, a printed circuit board, or the like. The bonding between die 50 and package component 52 may be performed through solder bumps 54, for example. In alternative embodiments, additional layers and features (not shown) such as additional passivation layers, metal pads (aluminum pads, for example), and metal bumps (solder bumps or copper bumps, for example), may be formed over passivation layer 40.

In accordance with embodiments, a device includes a top metal layer; a UTM line over the top metal layer and having a first thickness; and a passivation layer over the UTM line and having a second thickness. A ratio of the second thickness to the first thickness is less than about 0.33.

In accordance with other embodiments, a device includes a semiconductor substrate, and a plurality of metal layers over the semiconductor substrate and including a top metal layer. A first and a second UTM line are over the top metal layer and having a first thickness greater than about 20 kÅ. A passivation layer is disposed over the first and the second UTM lines. The passivation layer has a second thickness, wherein a ratio of the second thickness to the first thickness is less than about 0.33. The passivation layer has first portions over and vertically overlapping the first and the second UTM lines, and second portions on sidewalls of the first and the second UTM lines. The passivation layer includes a silicon oxide layer contacting the first and the second UTM lines, and a silicon nitride layer over and contacting the silicon oxide layer.

In accordance with yet other embodiments, a device includes a plurality of metal layers over a semiconductor substrate and comprising a top metal layer; a via dielectric layer over the top metal layer; and a first and a second UTM line over the top metal layer and having a first thickness greater than about 20 kÅ. A metal via is disposed in the via dielectric layer, wherein the metal via is between and interconnecting a metal line in the top metal layer and the first UTM line. A passivation layer is disposed over the first and the second UTM lines. The passivation layer includes first portions directly over the first and the second UTM lines, second portions on sidewalls of the first and the second UTM lines, and a third portion contacting a top surface of the via dielectric layer. The first, the second, and the third portions having thicknesses close to each other, with a ratio of a second thickness of the first portions of the passivation layer to the first thickness being less than about 0.33.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a top metal layer;
   an Ultra-Thick Metal (UTM) line over the top metal layer and having a first thickness, wherein a ratio of the first thickness to a thickness of the top metal layer is greater than about 3;
   a via dielectric layer over the top metal layer and under the UTM line;
   metal vias in the via dielectric layer, the metal vias extending from the top layer to the UTM line; and
   a passivation layer over the UTM line and the via dielectric layer, the passivation layer having a second thickness, wherein a ratio of the second thickness to the first thickness is less than about 0.33.

2. The device of claim 1, wherein the first thickness is greater than about 20 kÅ.

3. The device of claim 1, wherein the passivation layer comprises a first portion over and contacting a top surface of the UTM line, and a second portion contacting a sidewall of the UTM line.

4. The device of claim 3, wherein the passivation layer further comprises a third portion contacting a top surface of the via dielectric layer, and wherein a top surface of the third portion is lower than the top surface of the UTM line.

5. The device of claim 4, wherein the first portion, the second portion, and the third portion have substantially a same thickness.

6. The device of claim 1, wherein the passivation layer comprises a silicon oxide layer contacting the UTM line, and a silicon nitride layer over and contacting the silicon oxide layer.

7. The device of claim 1, wherein no additional layers are formed over and contacting the passivation layer.

8. A device comprising:
   a semiconductor substrate;
   a plurality of metal layers over the semiconductor substrate and comprising a top metal layer;
   a first and a second Ultra-Thick Metal (UTM) line over the top metal layer and having a first thickness, wherein a ratio of the first thickness of the first and second UTM lines to a thickness of the top metal layer is greater than about 3;
   a via dielectric layer over the top metal layer and under the first and the second UTM lines;
   metal vias extending from the first and the second UTM lines to metal lines in the top metal layer; and
   a passivation layer having a second thickness, wherein a ratio of the second thickness to the first thickness is less than about 0.33, wherein the passivation layer comprises first portions over and vertically overlapping the first and the second UTM lines, and second portions on sidewalls of the first and the second UTM lines, and wherein the passivation layer comprises a silicon oxide layer contacting the first and the second UTM lines, and a silicon nitride layer over and contacting the silicon oxide layer.

9. The device of claim 8, wherein the first thickness is greater than about 20 kÅ.

10. The device of claim 8, wherein first portions of the passivation layer contact top surfaces of the first and the second UTM lines, and wherein second portions of the passivation layer contact the sidewalls of the first and the second UTM lines.

11. The device of claim 8, wherein the passivation layer further comprises a third portion contacting a top surface of the via dielectric layer.

12. The device of claim 11, wherein the first portions and the third portion of the passivation layer have substantially a same thickness.

13. The device of claim 8, wherein the ratio of the second thickness to the first thickness is smaller than about 0.25.

14. A device comprising:
   a semiconductor substrate;
   a plurality of metal layers over the semiconductor substrate and comprising a top metal layer;
   a via dielectric layer over the top metal layer;
   a first and a second Ultra-Thick Metal (UTM) line over the top metal layer and having a first thickness greater than about 20 kÅ, wherein a ratio of the first thickness of the first and second UTM lines to a thickness of the top metal layer is greater than about 3;
   a metal via in the via dielectric layer, wherein the metal via is between and interconnecting a metal line in the top metal layer and the first UTM line; and
   a passivation layer over the first and the second UTM lines, wherein the passivation layer comprises first portions directly over the first and the second UTM lines, second portions on sidewalls of the first and the second UTM lines, and a third portion contacting a top surface of the via dielectric layer, with the first, the second, and the third portions having thicknesses close to each other, and wherein a ratio of a second thickness of the first portions of the passivation layer to the first thickness is less than about 0.33.

15. The device of claim 14, wherein the second portions have a thickness greater than about 70 percent of a thickness of the first portions.

16. The device of claim 14, wherein no additional layers are formed over the passivation layer, and wherein the device is bonded to a package component selected from the group consisting essentially of a package substrate, an interposer, and a printed circuit board.

17. The device of claim 14, wherein the first and the second UTM lines comprise aluminum copper.

18. The device of claim 14, wherein the metal via extends from the metal line in the top metal layer to the first UTM line.

* * * * *